United States Patent
Kitano et al.

(10) Patent No.: US 6,811,613 B2
(45) Date of Patent: Nov. 2, 2004

(54) COATING FILM FORMING APPARATUS

(75) Inventors: Takahiro Kitano, Kunamoto (JP); Norihisa Koga, Kunamoto (JP); Toshichika Takei, Kunamoto (JP); Yoshiyuki Kawafuchi, Kunamoto (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/298,932

(22) Filed: Nov. 19, 2002

(65) Prior Publication Data
US 2003/0097983 A1 May 29, 2003

(30) Foreign Application Priority Data
Nov. 26, 2001 (JP) ......................................... 2001-359220

(51) Int. Cl.$^7$ ................................................. B05B 11/00
(52) U.S. Cl. ......................... 118/684; 118/679; 118/712; 118/321; 118/323
(58) Field of Search ............................... 118/712, 679, 118/684, 321, 323; 474/201, 249

(56) References Cited

U.S. PATENT DOCUMENTS

| | | | | |
|---|---|---|---|---|
| 1,860,269 A | * | 5/1932 | Stokes | 474/249 |
| 1,994,604 A | * | 3/1935 | Bohne | 474/251 |
| 5,725,664 A | * | 3/1998 | Nanbu et al. | 118/52 |
| 6,056,998 A | * | 5/2000 | Fujimoto | 427/240 |
| 6,267,516 B1 | * | 7/2001 | Nagamine et al. | 396/604 |
| 6,416,583 B1 | | 7/2002 | Kitano et al. | |
| 6,491,974 B1 | * | 12/2002 | Gordon | 427/207 |
| 2001/0003968 A1 | * | 6/2001 | Kitano et al. | 118/302 |

FOREIGN PATENT DOCUMENTS

JP  06-106114 A  * 4/1994

* cited by examiner

Primary Examiner—Richard Crispino
Assistant Examiner—George R. Koch, III
(74) Attorney, Agent, or Firm—Oblon, Spivak, McClelland, Maier & Neustadt, P.C.

(57) ABSTRACT

A substrate is horizontally held by a substrate holding portion freely movable in the Y-direction, and a nozzle portion is provided above and opposing the substrate, and movable in X-direction corresponding to the coating liquid feeding region of the substrate. A discharge opening is formed at a lower end of the nozzle portion, and a channel connecting the discharge opening with a coating liquid feed tube coupled to an upper end of the nozzle portion is formed within the discharge opening. At the midstream of the channel, a liquid pool portion larger in diameter than the discharge opening is formed, the inside of which is provided with a filtering member formed by porous bodies blocking the channel. The filtering member forms a pressure loss portion, which absorbs pulsation occurring at the coating liquid feed tube before it reaches the discharge opening.

11 Claims, 19 Drawing Sheets

COATING FILM FORMING APPARATUS

BACKGROUND OF THE INVENTION

1. Field of the Invention

The present invention relates to a technique of feeding coating liquid to various substrates such as a semiconductor wafer, a glass substrate for liquid crystal display or a reticle substrate for photomask, to form a liquid film of the coating liquid on the surface of such a substrate.

2. Description of the Background Art

Conventionally, the coating process of resist liquid performed to obtain a desired circuit pattern in manufacturing of a semiconductor device or the like has been carried out by a so-called spin coating method. This method is to form a liquid film (resist film) on the entire surface of a wafer by feeding coating liquid from a nozzle provided above a middle portion of the wafer, which is a substrate to be processed, horizontally held by a rotatable spin chuck or the like, while rotating the wafer for diffusion of the resist liquid by the centrifugal force of the wafer.

To accommodate the recently-increasing demand of miniaturization of circuit patterns, it is required to reduce the thickness of the resist film. In the spin coating method, the number of rotations of the wafer has been increased to meet such a requirement. If the wafer is rotated at a high speed, however, turbulent flow is likely to occur on the wafer surface especially when the wafer has a large size. The turbulent flow would cause unevenness of the film thickness on the entire wafer, which would make difficult to reduce the size of a pattern. Accordingly, the inventors have studied application of a coating film forming apparatus not using the spin coating method.

FIG. 23 shows an example of a nozzle unit in which a nozzle and a driving mechanism for moving the nozzle in the X-direction (from side to side) are integrated. A case body 11 shown in FIG. 23 is constituted by a front portion 12 and a rear portion 13. The upper and lower surfaces of front portion 12 are each provided with a slit 14 (not shown for the lower surface side), which defines the direction of movement of a coating liquid feed tube 15 provided through slit 14. A nozzle portion 16 for discharging the coating liquid downward is arranged at a tip of coating liquid feed tube 15. Coating liquid feed tube 15 and nozzle portion 16 are configured to move back and forth within an area defined by slit 14, by actuation of a belt driving portion 17 provided in rear portion 13.

At the coating process, nozzle portion 16 is moved back and forth (a scan is performed) in the X-direction as described above, while a wafer W placed below nozzle portion 16 is intermittently fed in the Y-direction. Further, the width of movement in the X-direction is changed in accordance with the width of a region to be fed with coating liquid, every time the intermittent feeding in the Y-direction is performed, to allow the coating liquid to be fed onto the surface of wafer W in the manner of a so-called single stroke of the blush.

However, as the method above is to form a liquid film on the entire wafer surface by lining up linear coated regions side by side, scanning time per one row of nozzle portion 16 must be shortened in order to reduce the total time required. For the time reduction, it is effective to move nozzle portion 16 at a high speed. Such operation, however, causes large vibration at e.g. belt driving portion 17, which is propagated to pulsate the coating liquid in coating liquid feed tube 15, causing variation in the pressure within coating liquid feed tube 15. The change in the pressure in coating liquid feed tube 15 is directly reflected in the discharge pressure of the coating liquid at nozzle portion 16, resulting in non-uniform feeding of the coating liquid from discharge opening 16a of nozzle portion 16, as shown in FIG. 26.

SUMMARY OF THE INVENTION

The present invention was made to solve the problems described above, and an object of the invention is to provide a technique that allows, in forming of a coating film on the surface of a substrate by feeding coating liquid onto the substrate while moving a nozzle portion from side to side, stabilization of discharge of the coating liquid and formation of a coating film having high in-plane uniformity in the film thickness.

In order to solve the problems above, various approaches have been presented such as provision of a shock-absorbing movable body (balancer) at belt driving portion 17, which moves in a direction opposite and symmetrical to the movement of nozzle portion 16, or application of high pressure air to the periphery of a guide member (not shown) of nozzle portion 16 for suppressing mechanical friction at moving of nozzle portion 16. It was, however, difficult to completely remove vibration itself propagated to nozzle portion 16, and thus variation in the discharge pressure could not be sufficiently reduced by such approaches. The present inventors, therefore, have continuously pursued the reasons therefor, and have made an attempt to form a line of coating liquid on the surface of the wafer while moving nozzle portion 16 at 1 m/sec in the apparatus described above, and measure the surface height of the line with respect to time at the section of interest, to find that the surface has regular concave and convex portions at frequency of e.g. 200 Hz. This is assumed to be one cause of the vibration, since the frequency corresponds to the cycle at which groove 18a on the surface of belt 18 is engaged with tooth 19a on the surface of a cam 19 in belt driving portion 17 shown in FIGS. 27A and 27B. As illustrated, grooves 18a and teeth 19a are both formed in parallel, and it is assumed that the vibration occurs when the tip of tooth 19a touches the inner surface of groove 18a, which is repeated.

According to one aspect of the present invention, a coating film forming apparatus includes a substrate holding portion holding a substrate, a nozzle portion feeding coating liquid to the substrate held by the substrate holding portion via a discharge opening formed at a tip, a coating liquid feed path feeding coating liquid to the nozzle portion, a channel connecting the discharge opening and the coating liquid feed path in the nozzle portion and having a section larger in a diameter than the discharge opening, a pressure loss portion causing pressure loss in the coating liquid flowing through the channel, a first driving portion moving said nozzle portion in a first direction (side-to-side direction) along a substrate surface, and a second driving portion intermittently moving said nozzle portion relative to the substrate in a second direction (back-and-forth direction) crossing said first direction. The nozzle portion is moved in the side-to-side direction to apply the coating liquid linearly on the substrate surface, and is intermittently moved relative to the substrate such that the linear coated regions are lined up in the back-and-forth direction.

In such a structure, even if pulsation occurs in the coating liquid feed path due to vibration caused at the first driving portion at moving of the nozzle portion in the side-to-side direction, the pressure loss portion in the nozzle portion can absorb the pulsation, preventing propagation of the vibration to the discharge opening side. Accordingly, the discharge pressure of the coating liquid at the discharge opening is stabilized, so that a coating film having a high in-plane uniformity in the film thickness can be formed on the substrate surface. For the pressure loss portion, preferably, a filtering member is used, and specifically, a tubular body formed by layering a plurality of porous bodies, having one end opened may be used. In addition to the effects described above, such a structure allows removal of impurities from the coating liquid as the coating liquid passes through the filtering member, so that a coating film having high purity can be formed on the substrate, improving a product yield.

Moreover, the nozzle portion may be a sphere provided with a channel having a portion with a circular cross section, the circular portion being closed by the pressure loss portion, the sphere having microscopic concave portions formed on the surface thereof such that a small gap is produced between the sphere and the circular portion. The nozzle portion may also be configured to have a channel provided with a first liquid pool portion larger in diameter than the discharge opening, a communicating channel smaller in diameter than the first liquid pool portion, and a second liquid pool portion larger in diameter than the communicating channel, in this order from the discharge opening side. Either structure can absorb the pulsation occurring at the coating liquid feed path side, and can prevent propagation thereof to the discharge opening side. It is noted that the filtering member and the sphere may more effectively be arranged within a liquid pool portion formed in a channel, having a diameter larger than either one of the diameters at the upper end of the discharge opening and at the tip end of the coating liquid feed path.

Preferably, the coating film forming apparatus further includes a coating liquid feed portion applying a pressure on coating liquid to feed the coating liquid to the nozzle portion, and a flowmeter measuring a flow rate of coating liquid in a channel from the coating liquid feed portion to the nozzle portion. The flow rate from the coating liquid feed portion to the nozzle portion is adjusted in accordance with the flow rate of the coating liquid measured by the flowmeter.

According to another aspect of the present invention, a coating film forming apparatus includes a substrate holding portion holding a substrate, a nozzle portion feeding coating liquid to the substrate held by the substrate holding portion, a first driving portion moving the nozzle portion in a first direction (side-to-side direction) along a substrate surface, a vibration absorbing means interposed between the first driving portion and the nozzle portion so as to suppress propagation of vibration occurring at the first driving portion to the nozzle portion, and a second driving portion intermittently moving the nozzle portion in a second direction (back-and-forth direction) crossing the first direction relative to the substrate. The nozzle portion is moved in the side-to-side direction to apply the coating liquid linearly on the substrate surface, and is intermittently moved relative to the substrate such that the linear coated regions are lined up in the back-and-forth direction.

Such a structure allows the vibration absorbing means to absorb the vibration occurring at the first driving portion, preventing propagation of the vibration to the nozzle portion side. Preferably, the vibration absorbing means includes a portion made of an elastic body between the first driving portion and the nozzle portion, the elastic body being, for example, rubber, leaf spring or the like.

Preferably, the coating film forming apparatus further includes a coating liquid feeding portion applying a pressure on coating liquid so as to feed the coating liquid to a nozzle portion, and a flowmeter measuring a flowrate of the coating liquid in the channel from the coating liquid feed portion to the nozzle portion. The flowrate from the coating liquid feed portion to the nozzle portion is adjusted in accordance with the flowrate of the coating liquid measured by the flowmeter.

According to a further aspect of the present invention, a coating film forming apparatus includes a substrate holding portion holding a substrate, a nozzle portion feeding coating liquid to the substrate held by the substrate holding portion, a first driving portion moving the nozzle portion in a first direction (side-to-side direction) along a substrate surface, and a second driving portion intermittently moving the nozzle portion relative to the substrate in a second direction (back-and-forth direction) crossing the first direction. The first driving portion includes an endless belt provided along the side-to-side direction so as to correspond to a movement region of the nozzle portion, and having an inner surface on which a number of grooves and teeth are formed extending in parallel so as to form an acute angle to the first direction, and a pair of pulleys having grooves and teeth engaged with the grooves and teeth of the endless belt over an entire side circumferential surface such that the endless belt can be rotated. The nozzle portion is moved in the side-to-side direction to apply the coating liquid linearly on the substrate surface, and is intermittently moved relative to the substrate such that the linear coated regions are lined up in the back-and-forth direction. Such a structure can prevent occurrence of vibration itself at a vibration source, allowing stabilized discharge pressure of the coating liquid from the nozzle portion.

Preferably, the coating film forming apparatus further includes a coating liquid feed portion applying a pressure on coating liquid to feed the coating liquid to the nozzle portion, and a flowmeter measuring a flow rate of coating liquid in a channel from the coating liquid feed portion to the nozzle portion. The flow rate from the coating liquid feed portion to the nozzle portion is adjusted in accordance with the flow rate of the coating liquid measured by the flowmeter.

The present invention also includes the structure below. The coating film forming apparatus includes a substrate holding portion holding a substrate, a nozzle portion feeding coating liquid to the substrate held by the substrate holding portion via a discharge opening formed at a tip, a coating liquid feed path feeding coating liquid to the nozzle portion, a first driving portion moving the nozzle portion in a side-to-side direction, and a second driving portion intermittently moving the nozzle portion relative to the substrate in a back-and-forth direction.

By moving the nozzle portion in the side-to-side direction, the coating liquid is linearly applied onto the substrate surface, the nozzle portion being intermittently moved relative to the substrate such that the linear coated regions are lined up in the back-and-forth direction. The coating film forming apparatus further includes at least two of the components (A) to (C) as follows:

(A) a pressure loss portion that connects the discharge opening with the coating liquid feed path in the nozzle portion, and causes pressure loss at a channel having a section larger in diameter than the discharge opening and at the coating liquid flowing through the channel, (B) a vibration absorbing means interposed between the first driving portion and the nozzle portion so as to prevent propagation of vibration occurring at the first driving portion to the nozzle portion, and (C) the first driving portion being provided along the first direction to correspond to the movement region of the nozzle portion, an endless belt having an inner surface on which a number of grooves and teeth are formed extending in parallel so as to form an acute angle to the first direction, and a pair of pulleys formed over the entire side circumferential surface of a groove and a tooth engaged with the groove and the tooth so as to rotate the endless belt.

Such a structure can further improve stabilization of the discharge pressure of the coating liquid at a discharge opening, which is a common object of the components above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the coating film forming apparatus according to the present invention will sequentially be described below from the first to the third embodiments, for an example where a resist film is formed on a substrate.

First Embodiment

Figure 1:
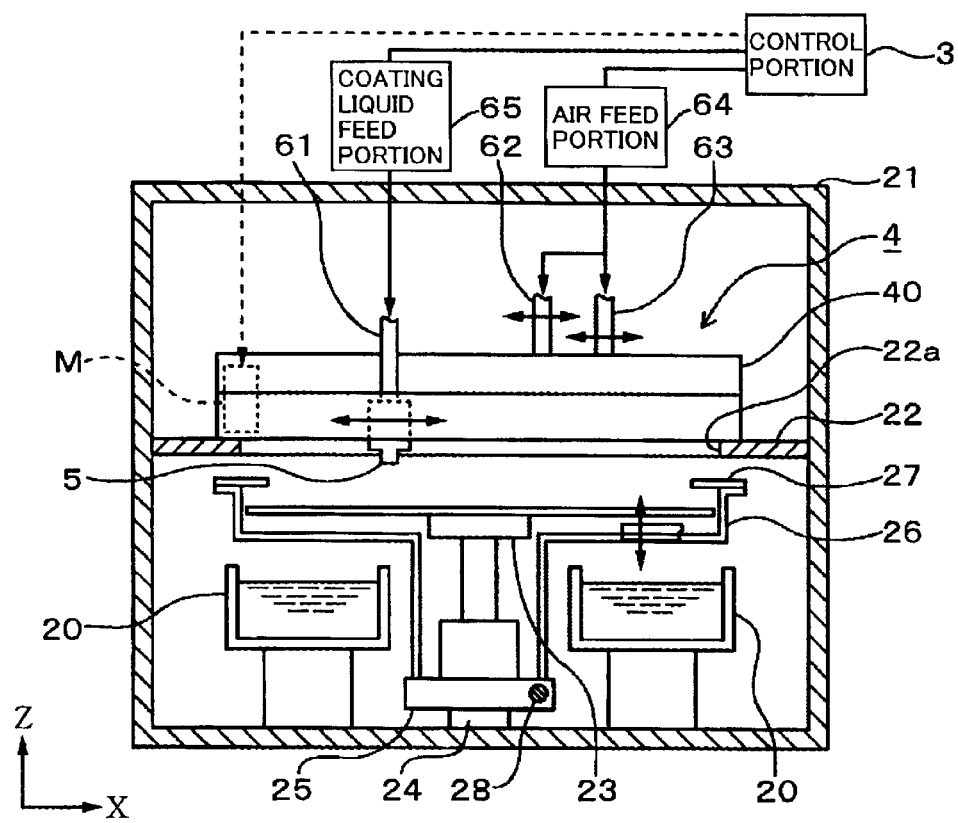
FIG. 1 is a vertical section view showing the first embodiment of a coating film forming apparatus according to the present invention.

First, the coating film forming apparatus according to the present embodiment includes a cabinet 21 forming an outer body as shown in FIG. 1, which has an internal space divided into upper and lower parts by a horizontal partition board 22. A semiconductor wafer (hereinafter simply referred to as a wafer) W which is a substrate is horizontally held by a substrate holding portion 23 provided below partition board 22, and is fed with coating liquid via a slit 22a formed on partition board 22 and extending in the X-direction, from a nozzle portion 5 included in a nozzle unit 4 provided above partition board 22.

Substrate holding portion 23 horizontally holds wafer W at an upper end thereof, the lower part of which is supported by a movable body 25 moving while guided by a rail 24 extending in the Y-direction (back-and-forth direction). Movable body 25 is provided thereon a mask support member 26 that encloses substrate holding portion 23 and wafer W supported thereby and that is raised to a level somewhat higher than the surface of wafer W. A mask member 27 is provided on an upper end of mask support member 26 in a removable manner, which is opened such that resist liquid fed from an upper side is adhered only to a coating film forming region W1 (see FIG. 2) of wafer W.

Figure 2:
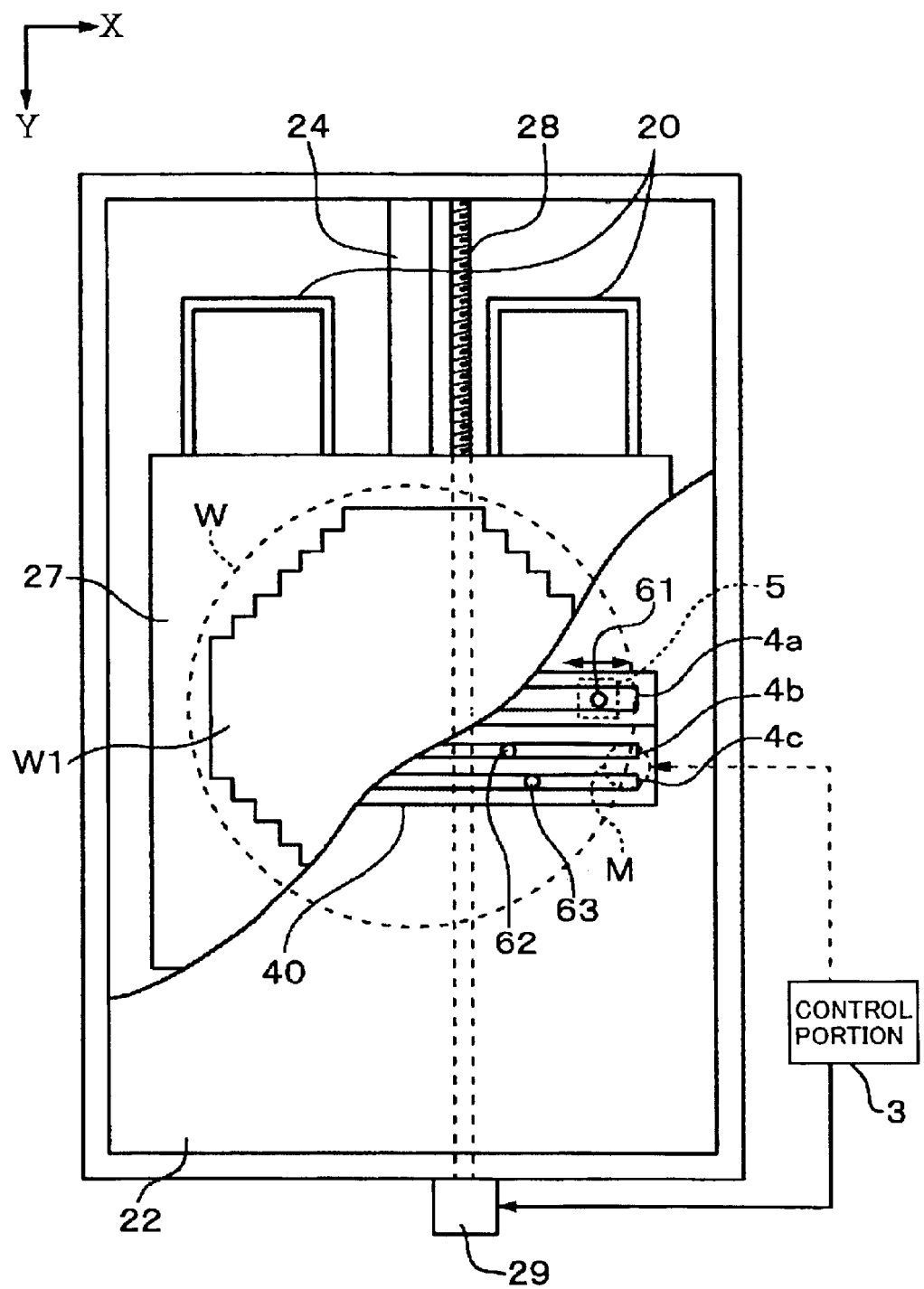
FIG. 2 is a plan view showing the first embodiment of the coating film forming apparatus according to the present invention.

Further, as shown in FIG. 2, a penetrating ball screw 28 is provided along a rail 24 in movable body 25, so as to allow movable body 25 to move back and forth by an action of a motor 29 provided on, for example, an outer wall surface of cabinet 21. Rail 24, movable body 25, ball screw 28 and motor 29 constitute a second driving portion in the claims. Driving control of motor 29 by a control portion 3 provided, for example, external to cabinet 21 allows wafer W to move to an arbitrary position. It is noted that a reservoir 20 shown in FIG. 2 reserves a solvent of the same type as that included in the resist liquid, for example, thinner.

Nozzle unit 4 is now described. Nozzle unit 4 has a lower side supported by partition board 22 as described earlier, and is constituted by nozzle portion 5 and a first driving portion for driving nozzle portion 5, which will be described later (not shown in FIGS. 1 and 2). Nozzle unit 4 is enclosed by a case body 40, the upper surface of case body 40 having slit 4a extending in the X-direction (side-to-side direction, a first direction) so as to allow movement of coating liquid feed tube 61 that forms a coating liquid feed path connected to nozzle portion 5, and slits 4b, 4c for allowing movement of two air feed tubes 62, 63, which will be described later. The lower surface of case body 40 also has a slit (not shown) so as not to hinder application of resist liquid by nozzle portion 5.

Figure 3:
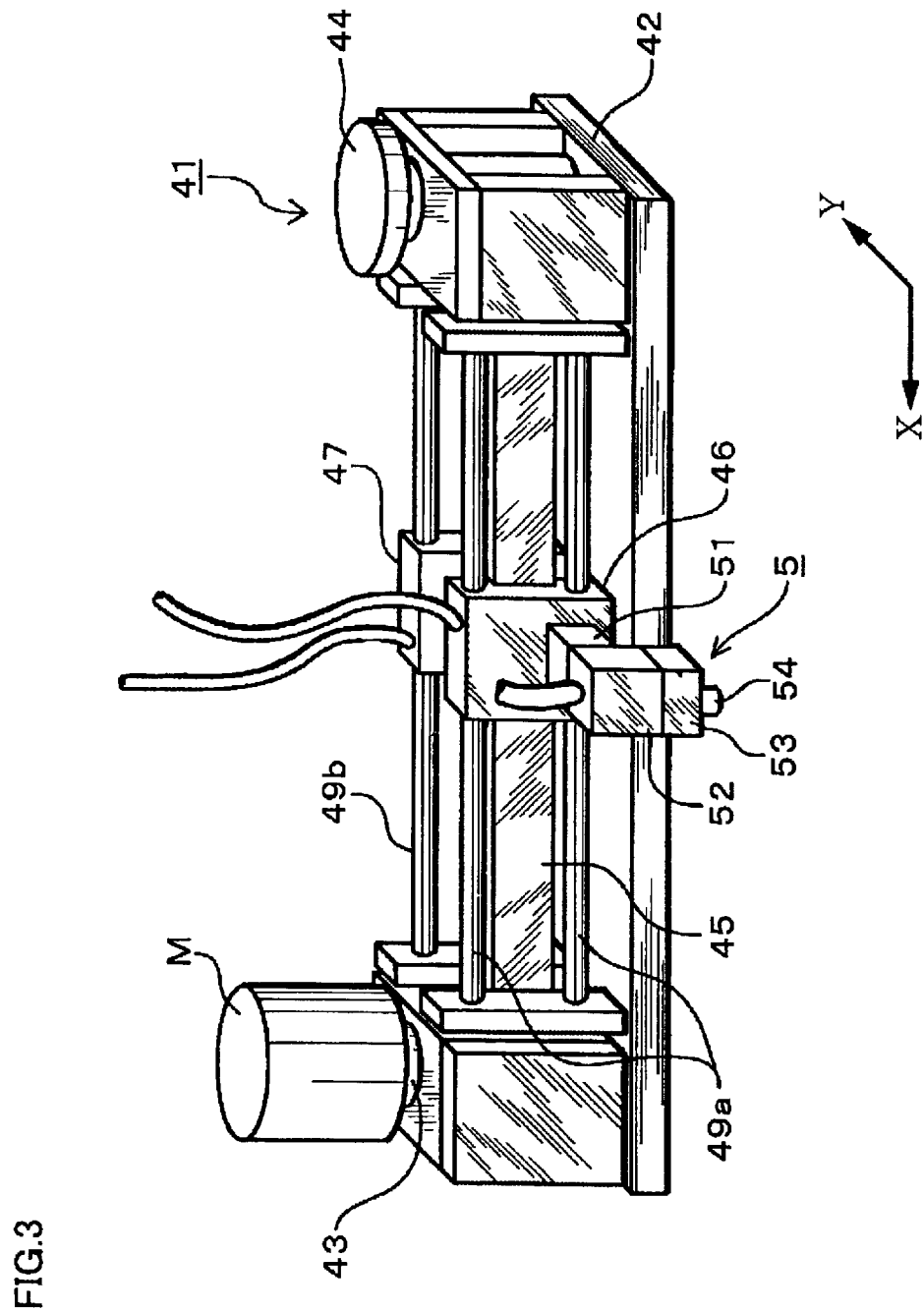
FIG. 3 is a perspective view showing the structure of a nozzle portion and an X-direction driving portion when a case body is removed.
Figure 4:
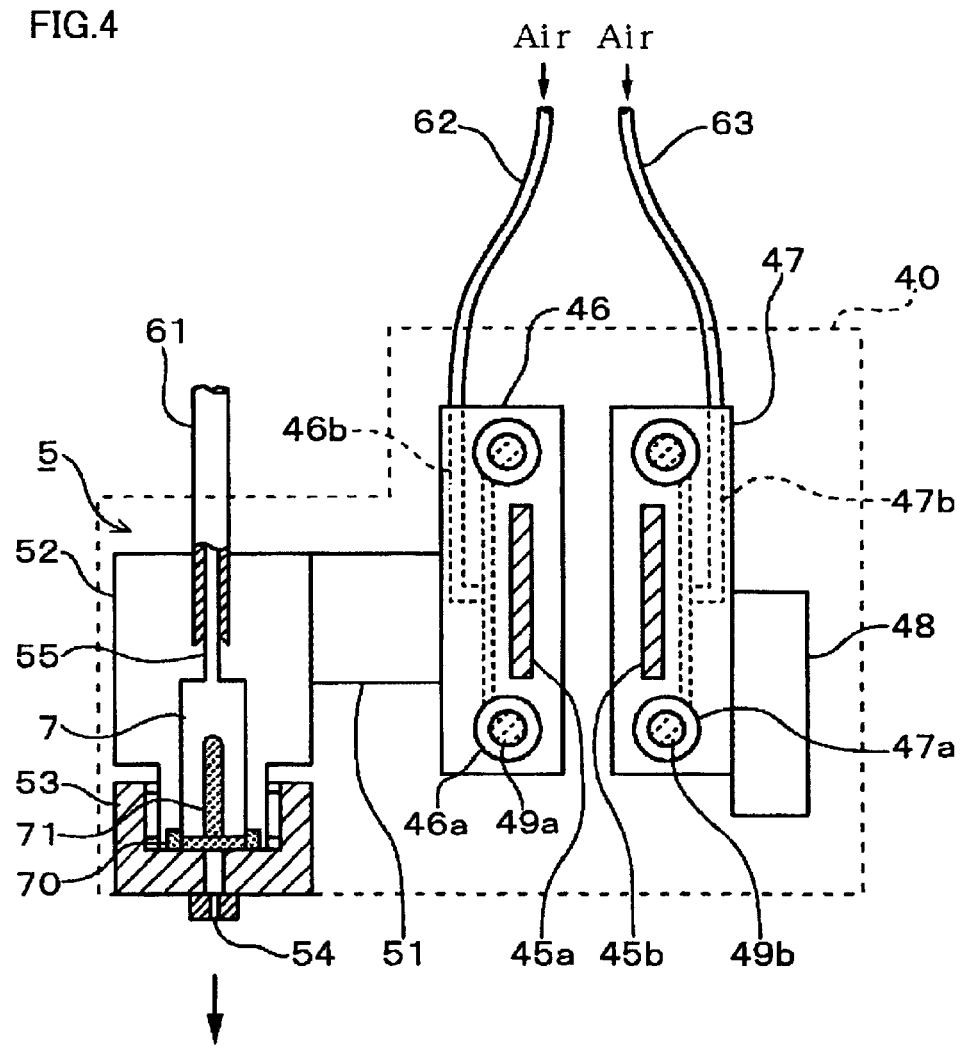
FIG. 4 is a vertical section view showing the internal structure of the X-direction driving portion (first driving portion)

FIGS. 3 and 4 are perspective views showing the internal structure of nozzle unit 4 without case body 40, which will be referenced in the description below. An X-direction driving portion 41 forming the first driving portion includes a rectangular base 42 extending in the X-direction, a driving pulley 43 provided at both ends of base 42, a driven pulley 44, and an endless belt 45 put on each of pulleys 43, 44. When driving pulley 43 is rotated by a motor M provided on top of driving pulley 43, endless belt 45 rotates with the reciprocal rotation of driving pulley 43.

A parallel pair of belt portions of endless belt 45 that are put on pulleys 43, 44 are denoted by 45a, 45b, respectively. Belt portion 45a on one side is provided with nozzle portion 5 with a nozzle support 46 interposed, while belt portion 45b on the other side is provided with a weight 48, with a balancer 47 interposed, for taking a balance with the nozzle portion 5 (nozzle support 46) side to cancel out vibration. These belt portions 45a, 45b move symmetrically in opposite directions as endless belt 45 rotates. Two parallel guide shafts 49a and 49b both extending in the X-direction are arranged between driving pulley 43 and driven pulley 44, and are configured to guide nozzle support 46 and balancer 47 in the X-direction. It is noted that weight 48 is not shown in FIG. 3 for convenience.

Nozzle support 46 and balancer 47 have the same internal structure except that they are facing each other symmetrically. As shown in the vertical section view of FIG. 4, nozzle support 46 (balancer 47) is fixed to belt portion 45a (45b). In a through hole 46a (47a) of nozzle support 46 (balancer 47) through which guide shaft 49a (49b) penetrates, a gap for allowing air to flow around guide shaft 49a (49b) is formed, which is configured as an air guide mechanism. Through hole 46a (47a) is connected to air feed tube 62 (63) via a flow channel 46b (47b), and is configured to receive pressured air from air feed portion 64 provided, for example, external to the present apparatus (see FIGS. 1, 2).

Subsequently, nozzle portion 5 and the periphery thereof that are the substantial part of the present embodiment will be described in detail. Nozzle portion 5 is constituted by a connecting portion 51 having a rear side supported by nozzle support 46 as shown in FIGS. 3 and 4, a joint portion 52 connected to the front side of connecting portion 51 and having a coating liquid feed tube 61 inserted from an upper side, and a nozzle body 53 connected to the lower side of joint portion 52 and is configured, for example, to be freely removable. A discharge opening 54 with a diameter smaller than that of e.g. coating liquid feed tube 61 is formed at the tip of nozzle body 53. A flow channel 55 connecting the tip of coating liquid feed tube 61 with discharge opening 54 is formed within joint portion 52 and nozzle body 53. A section of flow channel 55 has a diameter larger than that of coating liquid feed tube 61. Here, this section is referred to as a liquid pool portion 7. A filtering member 71 is provided in liquid pool portion 7 for causing pressure loss in the coating liquid flowing through that section and filtering the coating liquid. An O-ring 70 is provided at a lower end of liquid pool portion 7 so as to be embedded in a sidewall at that section.

Figure 5:
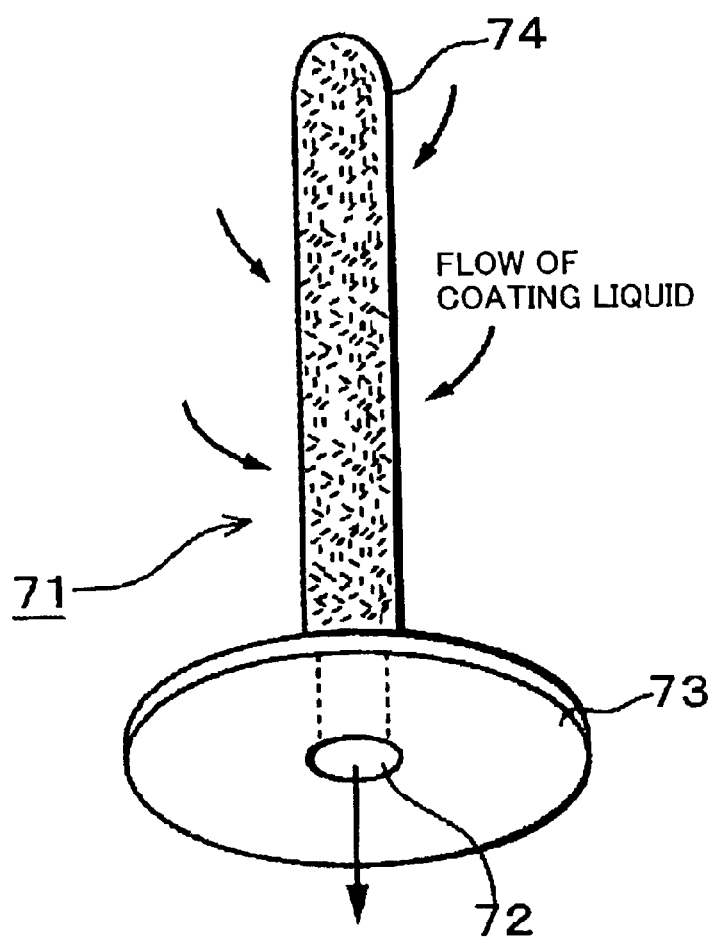
FIG. 5 is a schematic perspective view showing the structure of a filtering member.
Figure 6:
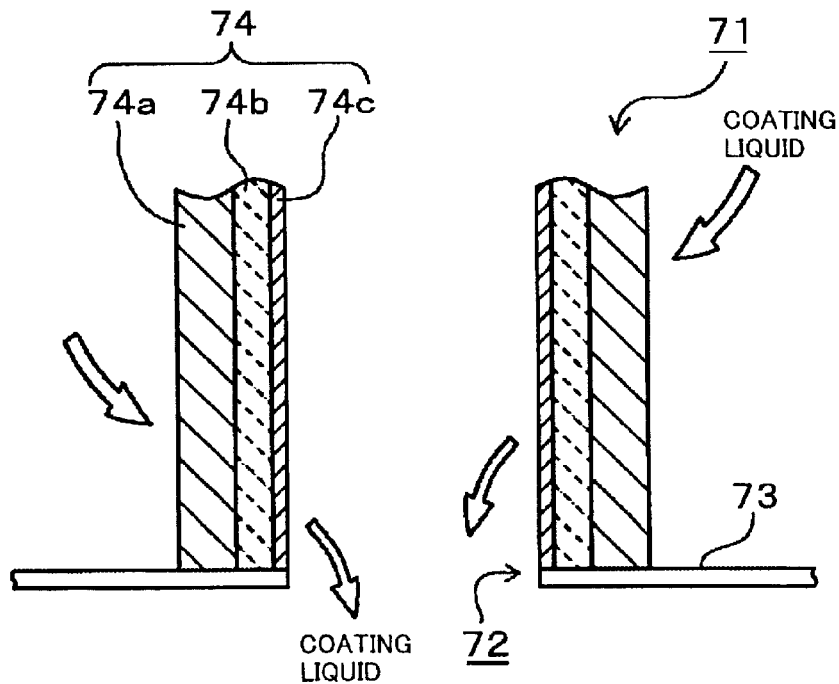
FIG. 6 is a partial vertical section view showing the structure of the filtering member.

The structure of filtering member 71 will be described with reference to FIGS. 4 to 6. The outer configuration of filtering member 71 includes, as shown in FIG. 5, a locating seat 73 having an opening 72 in the middle, and a tubular body 74 connected to an upper part of seat 73 and opened only at the lower side so as to communicate with opening 72. Tubular body 74 is formed, for example, by layering porous bodies having different pore diameters. For instance, three layers of porous bodies are arranged such that the pore diameter decreases, for example, from the outside to the inside. Specifically, an outer layer 74a has a diameter of 200 μm, a middle layer 74b has a diameter of 50 μm, and an inner layer 74c has a diameter of 0.65 μm. Further, filtering member 71 is provided such that seat 73 fits in the lower end of liquid pool portion 7 as shown in FIG. 4 for example, to block flow path 55. Thus, the coating liquid fed from coating liquid feed tube 61 necessarily flows through some section in tubular body 74 toward discharge opening 54.

Referring again to FIG. 1, a coating liquid feed path to nozzle portion 5 is now described. Coating liquid feed tube 61 has one end connected to nozzle portion 5 and the other end connected to a coating liquid feed portion 65 provided, for example, external to housing 21, and is configured to adjust the feeding amount of coating liquid by control portion 3 controlling coating liquid feed portion 65. Further, air feed portion 64 and motor M are also connected to control portion 3, such that these sections can be driven and fed by working with, for example, motor 29 described earlier.

The function of the present embodiment will now be described. First, wafer W enters into housing 21 via a conveying arm (not shown). Wafer W is then handed from the conveying arm to substrate holding portion 23 by, for example, up-and-down operation of a lift pin (not shown) or substrate holding portion 23. Wafer W moves in the Y-direction via movable body 25 by the action of motor 29 and ball screw 28, to be located such that an X-direction movement region of nozzle portion 5 is positioned at one end of wafer W. Nozzle portion 5 is moved to one end of a movement region in X-direction driving portion 41, to prepare for start of the coating process.

Thereafter, control portion 3 transmits an actuation signal to coating liquid feed portion 65, to start discharging of coating liquid from nozzle portion 5 and to move nozzle portion 5 in the X-direction from one end to the other end, while wafer W remains stationary. This allows the coating liquid to be linearly fed to the surface of wafer W. Here, coating liquid flows from coating liquid feed tube 61 to liquid pool portion 7 within nozzle portion 5. The coating liquid is filtered by a tubular body 74 (filtering member 71) in liquid pool portion 7, where particles are removed, so that only the purified coating liquid is fed onto wafer W.

Figure 7:
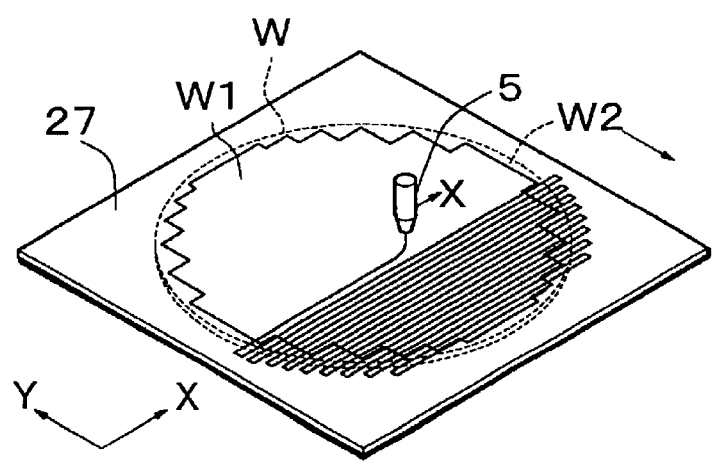
FIG. 7 illustrates the function in the first embodiment.

The discharge flow rate of resist liquid at nozzle portion 5 is different in accordance with a target film thickness, and is, for example, approximately 0.3–1.0 cc/min. In the period during which nozzle portion 5 turns back at one end of wafer W after scanning in one way and reaches a portion above coating liquid feed region W1 of wafer W on the way back, wafer W is moved in the Y-direction (back-and-forth direction, the second direction) toward the other end by a small amount, e.g. 1 mm, which is repeated while changing the reciprocating range in accordance with the width of coating liquid feed region W1, to form a thin film of coating liquid (coating film) on the surface of wafer W, as shown in FIG. 7.

As has been described, according to the present embodiment, an apparatus for feeding coating liquid onto wafer W while nozzle portion 5 performs reciprocating scan in the X-direction is configured to have filtering member 71 forming a pressure loss portion at liquid pool portion 7 within nozzle portion 5, to cause pressure loss in the coating liquid fed through coating liquid feed tube 61. Accordingly, even if pulsation occurs in coating liquid feed tube 61 due to vibration occurring at the driving portion side and swinging of coating liquid feed tube 61 associated with scanning by nozzle portion 5, the pulsation is absorbed while the coating liquid passes through filtering member 71 (tubular body 74), so that the coating liquid is stably discharged from discharge opening 54 and is fed onto the surface of wafer W with a stable discharge pressure.

Figure 8A:
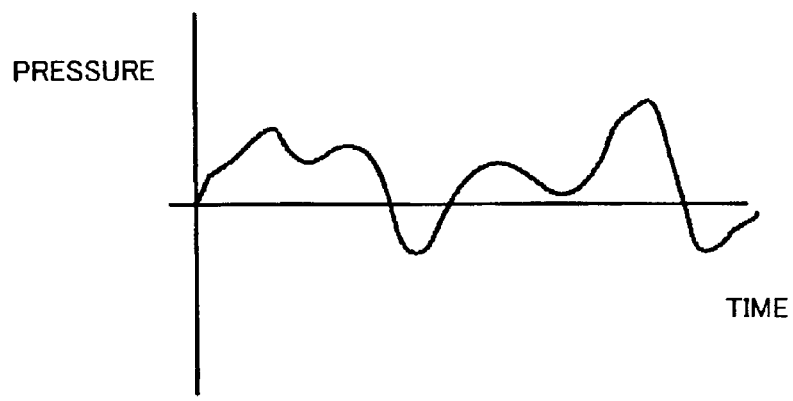
FIGS. 8A and 8B are characteristic graphs showing the function in the first embodiment.
Figure 8B:
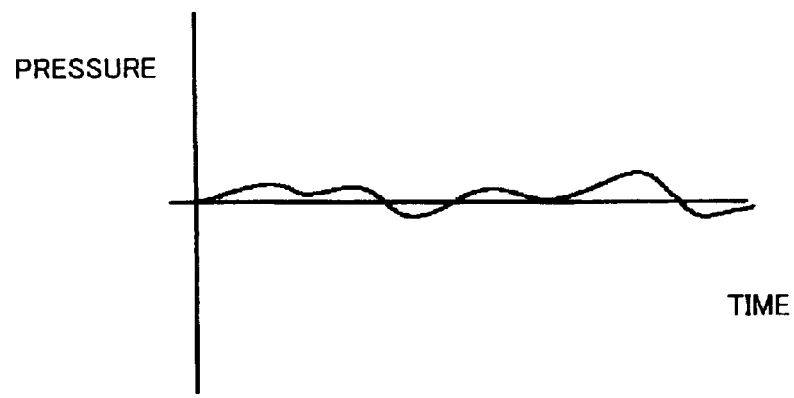

FIGS. 8A and 8B are characteristic graphs showing an example of a change in inner tube pressure of coating liquid feed tube 61 and in discharge pressure at discharge opening 54. It can be found that the change in the inner tube pressure of coating liquid feed tube 61 is relieved at discharge opening 54. Note that details will be compared and considered in the section of Example, which will be described later.

Liquid pool portion 7 has an effect of causing, though slightly, pressure loss, since coating liquid is once reserved therein. Further, filtering member 71 can capture impurities included in the coating liquid by three-layered porous material forming tubular body 74, while reliving the pulsation described above. Thus, in addition to improvement of the uniformity in the film thickness, a coating film having an extremely low degree of contamination of impurities can be formed on the surface of wafer W, resulting in effective improvement of yield.

Figure 9:
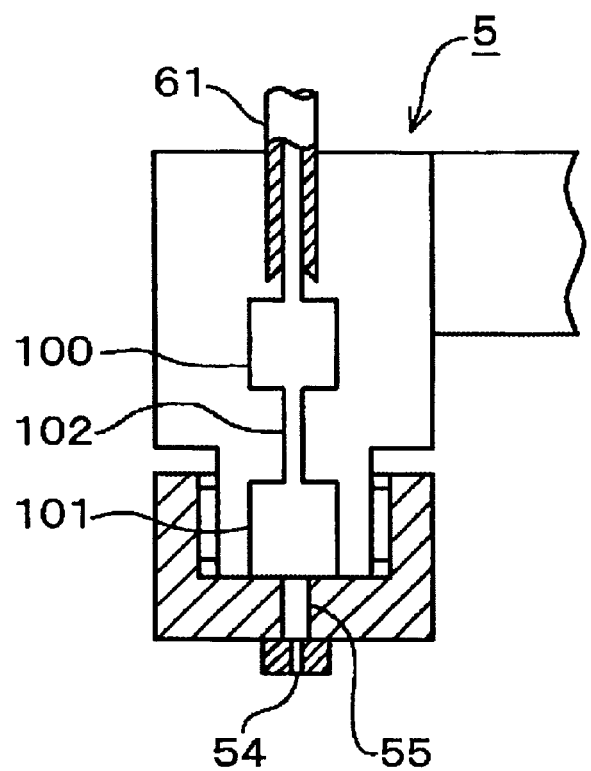
FIG. 9 is a schematic vertical section view showing another example of a pressure loss portion in the first embodiment.

The structure of the pressure loss portion at nozzle portion 5 is not limited to the one described above, and other structures can be applied that has a similar effect. According to the embodiment shown in FIG. 9, a first liquid pool portion 100 and a second liquid pool portion 101 having a diameter larger than that of discharge opening 54 are provided in sequence from above at channel 55 in the embodiment described above, which are connected with each other by a communicating channel 102 having a diameter smaller than those of liquid pool portions 100 and 101. In such a structure, the coating liquid supplied from coating liquid feed tube 61 to the channel 55 side is once reserved at first liquid pool portion 100 and flows, little by little, via communicating channel 102 toward second liquid pool portion 101, where a certain amount thereof is also reserved before gradually flowing to discharge opening 54. Thus, even if pulsation occurs in coating liquid feed tube 61, first and second liquid pool portions 100 and 101 relieve the pulsation, resulting in stable discharge pressure.

Figure 10:
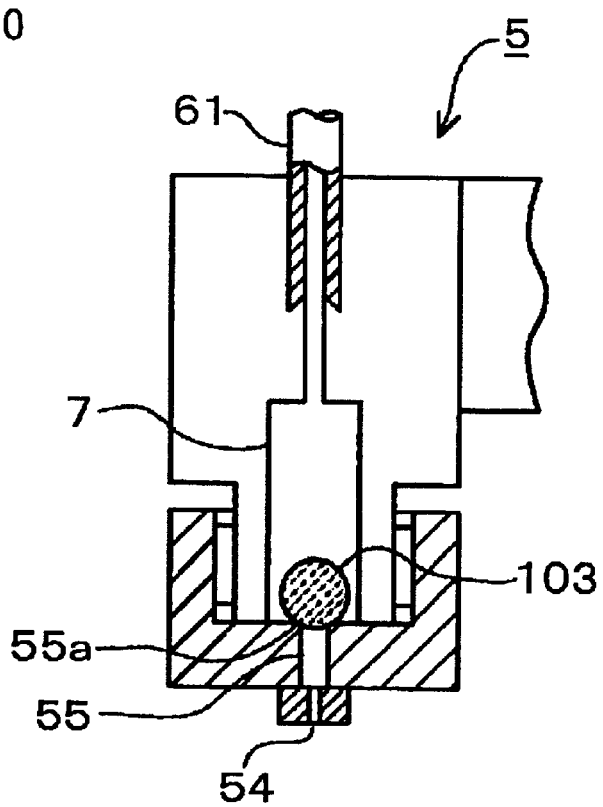
FIG. 10 is a schematic vertical section view showing a further example of a pressure loss portion in the first embodiment.

FIG. 10 shows another embodiment in which a sphere 103 is provided to close opening 55a having a circular cross section at a lower end of liquid pool portion 7, instead of filtering member 71 provided within liquid pool portion 7. Sphere 103 used here has fine flaws or dents on its surface, or distortion in its shape, such that a slight gap is produced between sphere 103 and opening 55a. In the present embodiment also, as in the two examples described above, the coating liquid is once reserved in liquid pool portion 7 before flowing toward discharge opening 54 via a narrow gap, allowing pulsation in coating liquid feed tube 61 to be relieved by the time it reaches discharge opening 54, resulting in stable discharge pressure.

Second Embodiment

The present embodiment is to suppress vibration affecting the discharge pressure in the coating liquid by an approach different from that of the first embodiment. Specifically, a vibration absorbing means is provided at a connecting portion 51, i.e. between nozzle support 46 and nozzle portion 5, in the first embodiment to prevent propagation of vibration occurring in the X-direction driving portion to nozzle portion 5. Sections other than the vibration absorbing means are, therefore, similar to those in the first embodiment, and thus are not shown here.

Figure 11:
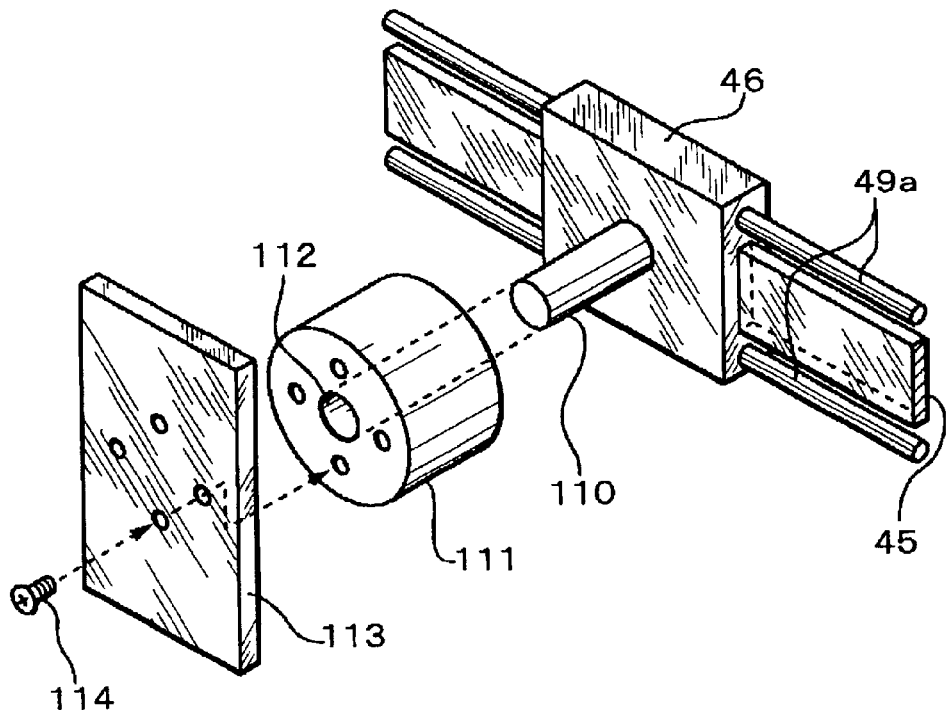
FIG. 11 is an exploded perspective view showing a substantial part of the second embodiment.

FIG. 11 is an exploded perspective view showing a substantial part in the present embodiment. A horizontal rod member 110 in FIG. 11 having one end connected to nozzle support 46 closely fits in a cylindrical rubber member 111 forming the vibration absorbing means such that a fitting hole 112 and rod member 110 do not move when nozzle portion 5 is moved. The tip surface of rubber member 111 is provided with a nozzle fixing plate 113, which is fixed, for example, by four screws 114 to rubber member 111. Moreover, a front surface opposite to rubber member 111 is connected with nozzle portion 5 via a fixing means (not shown).

Such a structure allows rubber member 111 to absorb the vibration caused by nozzle support 46 moving at a high speed in the coating process, preventing propagation of the vibration to the nozzle portion 5 side. Thus, the discharge pressure of the coating liquid is stabilized, and a uniform thickness of the coating film can be obtained as will be described in the embodiments below. Preferably, rubber member 111 is appropriately changed to have optimal elasticity in accordance with the moving pattern and the magnitude of vibration of nozzle portion 5. Further, the vibration absorbing means is not necessarily limited to rubber, and may be another elastic body, for example, a polyurethane elastic body.

Figure 12:
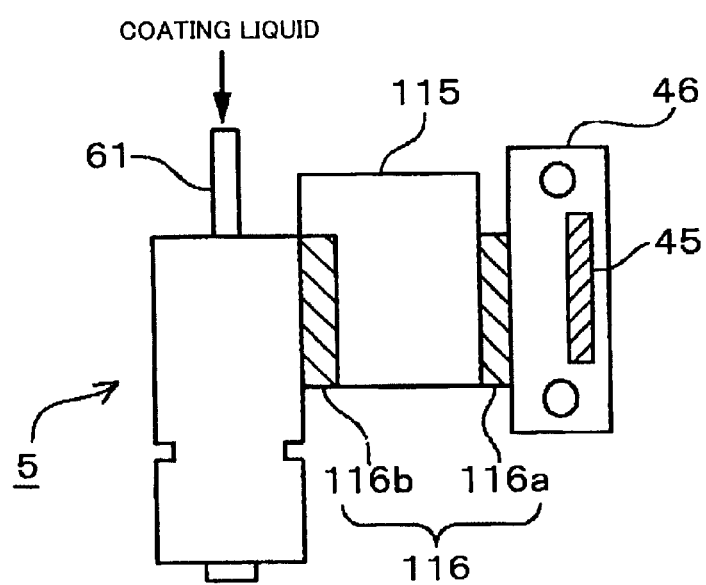
FIG. 12 is a vertical section view showing another example of the second embodiment.

The vibration absorbing means in the present embodiment is not limited to the structure using rubber member 111 above, and may be replaced by another structure to obtain a similar effect. Examples thereof will be listed below. First, an example shown in FIG. 12 illustrates a structure using a block body 115 interposed between nozzle support 46 and nozzle portion 5, in which platy rubber members 116 (116a, 116b) forming vibration absorbing means are adhered, respectively, between the rear surface of block body 115 and the front surface of nozzle support 46, and between the rear surface of nozzle portion 5 and the front surface of block body 115.

Figure 13:
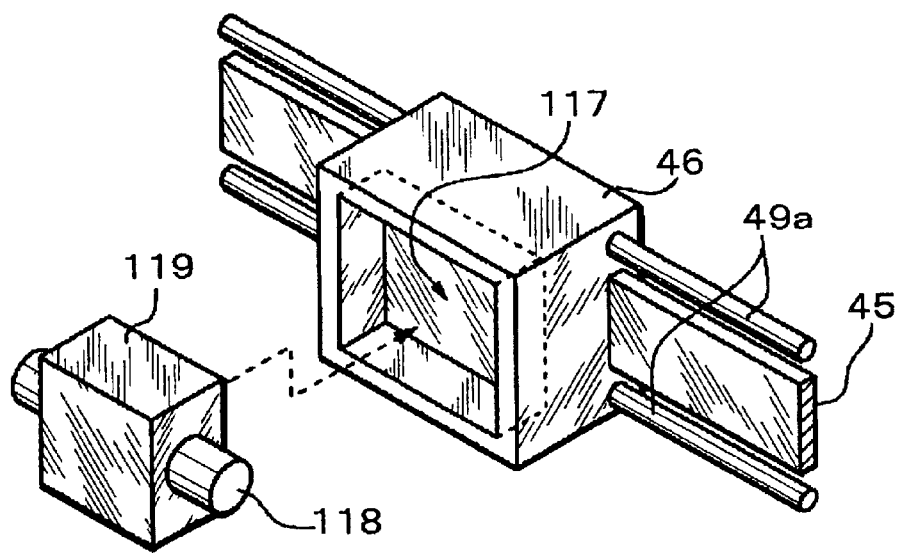
FIG. 13 is a schematic perspective view showing a further example of the second embodiment.

FIG. 13 shows another example where a recess 117 is formed on the front surface of nozzle support 46, and a block body 119 provided with rubber members 118 forming the vibration absorbing means at both sides thereof is fit into recess 117 with rubber members 118 retracted, and is fixed by pressing against the walls by the resilience of rubber members 118. In this structure, nozzle portion 5 is connected at a front part of block body 119. In the examples shown in FIGS. 12 and 13, the vibration absorbing means is interposed between nozzle support 46 and nozzle portion 5. Such a structure can, therefore, also suppress vibration.

Figure 14:
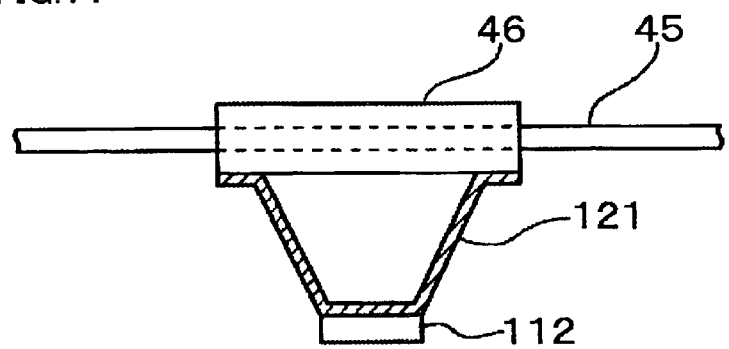
FIG. 14 illustrates a further example of the second embodiment.
Figure 15:
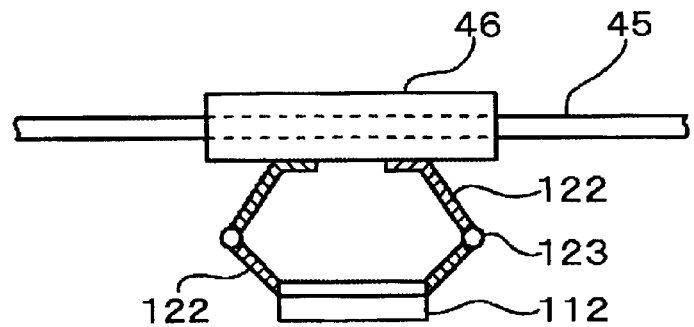
FIG. 15 illustrates yet another example of the second embodiment.

FIGS. 14 and 15 illustrate examples where other members are used in place of rubber member 111 shown in the embodiment of FIG. 11. FIG. 14 shows use of a leaf spring 121 to prevent propagation of vibration from nozzle support 46 to the nozzle portion 5 side by adjusting the strength of leaf spring 121 to be optimal, for example, to have low rigidity. FIG. 15 shows a structure in which the vibration absorbing means is formed by leaf spring 122 and a hinge 123, to prevent vibration by adjusting these parts.

Third Embodiment

Figure 16:
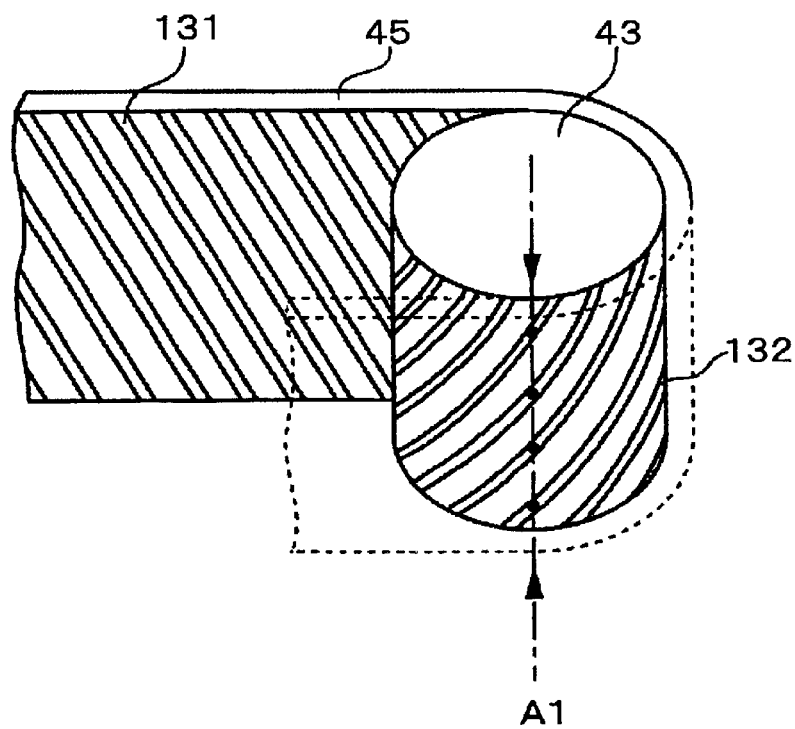
FIG. 16 is a schematic perspective view showing a substantial part in the third embodiment.

The present embodiment is to prevent occurrence of vibration itself, not to prevent propagation of the vibration occurred at the X-direction driving portion. The parts other than a pulley and a belt can have a structure similar to that in the two embodiments described above, so that only the substantial part is shown in FIG. 16. As illustrated, a groove portion 131 formed on the surface of an endless belt 45 is inclined toward the front side as it goes down for example, and teeth 132 are formed along a track which is to be a part of a spire at a circumferential surface of driving pulley 43 (driven pulley 44) so as to be engaged with grooves 131.

According to such a structure, when groove 131 is engaged with tooth 132 as in the conventional case, the lower end of each groove is first engaged and its engagement portion sequentially moves upward. That is, when viewed on the vertical line on the circumferential surface of driving pulley 43, each engagement section always has point contact. As can be seen from the section indicated by A1 in FIG. 16 for example, groove 131 is in contact with tooth 132 only at one point in each row in one X coordinate (four points in total in FIG. 16). Accordingly, vibration occurring at the engagement is small, so that the uniformity of the thickness of the coating film can be improved, as will be clearly seen in the embodiments below.

It is noted that the first to third embodiments above may be combined with one another, all of them may be combined, or only arbitrary two of them may be combined, to have a further higher effect compared to the coating process according to only one of the embodiments. For instance, in the combination of the first and third embodiments, regular vibration occurring when endless belt 45 is engaged with pulley 43 (44) in X-direction driving portion 41 can be suppressed, and pulsation that may occur in coating liquid feed tube 61 due to remaining slight vibration is cancelled in nozzle portion 5 and is hardly propagated to discharge opening 54, resulting in stable feeding of the coating liquid onto the surface of wafer W.

Further, if, for example, vibration frequency of endless belt 45 resonates nozzle support 46 or nozzle portion 5, the vibration frequency of endless belt 45 may be deviated from the frequency generating the resonance, for example, by increasing the width of endless belt 45, by placing a weight on nozzle portion 5, and by increasing the weight of nozzle portion 5 itself. Specifically, the vibration frequency at endless belt 45 is preferably set to be different from the vibration frequency at a resonated body by approximately ±20%, which further increases the in-plane uniformity of the coating film thickness. When the weight is used to prevent resonance, any section from endless belt 45 to nozzle portion 5 may be used to increase/decrease the weight.

Furthermore, the substrate used in the present embodiment may be a glass substrate for liquid crystal display, or a reticle substrate for photomask. Moreover, for the coating liquid, an interlayer insulating material, a low dielectric material, a ferroelectric material, a wiring material, an organometallic material, a metal paste and the like may be used, not limited to the resist liquid.

Figure 17:
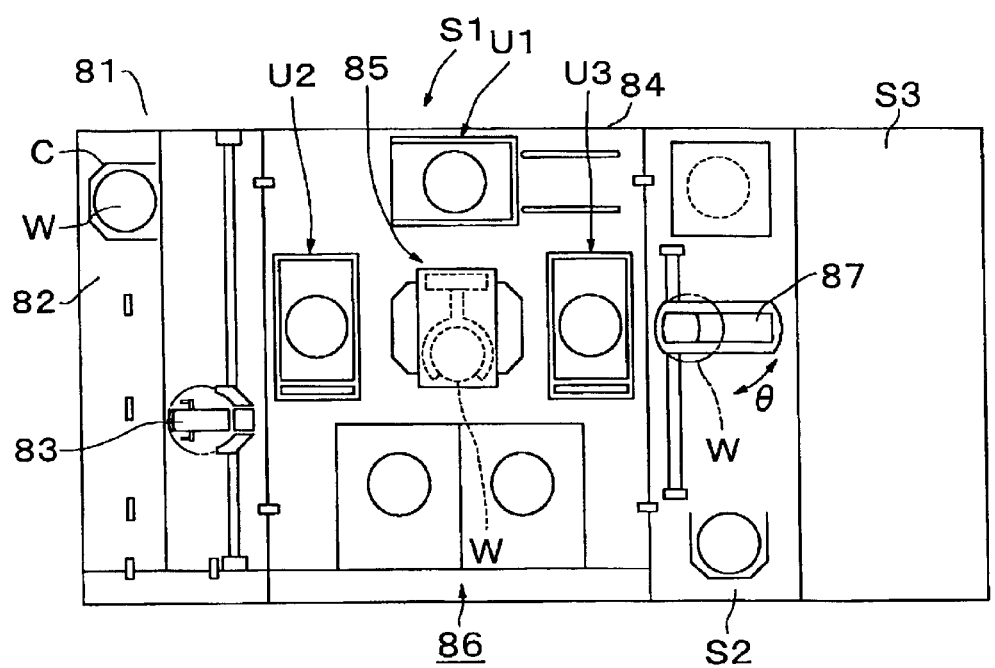
FIG. 17 is a plan view showing an example of a pattern forming apparatus into which a coating film forming apparatus is integrated.

A pattern forming apparatus that incorporates the coating film forming apparatus described above into a coating unit will briefly be described below with reference to FIG. 17. The apparatus includes a cassette station 81 including a cassette mounting portion 82 in which a cassette C containing e.g. 25 wafers W is mounted, and a handover means 83 for receiving and handing wafer W from/to the mounted cassette C. At the back of handover means 83, a treatment portion S1 enclosed by housing 84 is connected. A main conveying means 85 is provided at the center of treatment portion S1, which is surrounded by, for example, a liquid treating unit 86 formed by the combinatin of coating and developing units, arranged at the right side in the drawing, and shelf units U1, U2 and U3 including heating and cooling units and the like stacked in multiple stages, arranged at the left, front and back sides, respectively.

Shelf units U1, U2 and U3 are constituted by combining various units for performing treatments before and after liquid treating unit 86, and include, for example, a decompression and drying unit, a heating unit, and a cooling unit. As for shelf units U2 and U3, a handover unit provided with a handover table for handing wafer W is also incorporated. Moreover, main conveying means 85 described above is configured, for example, to be movable up and down and also back and forth, and to be rotatable around a vertical axis, allowing handover of wafer W among each unit constituting liquid treating unit 86 and shelf units U1, U2 and U3. An exposure unit S3 is connected at the back of treatment portion S1 via an interface unit S2. Interface unit S2 performs handover of wafer W between treatment unit S1 and exposure unit S3 by handover means 87 configured, for example, to be movable up and down, side to side, back and forth, and to be rotatable around the vertical axis.

Fourth Embodiment

Figure 18:
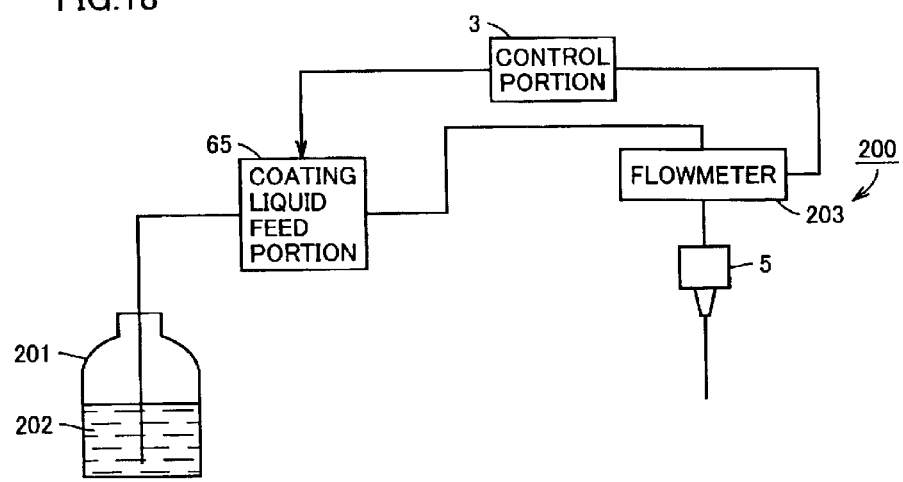
FIG. 18 is a schematic view of a coating film forming apparatus according to the fourth embodiment of the present invention.

FIG. 18 is a schematic view of a coating film forming apparatus according to the fourth embodiment of the present invention. As shown in FIG. 18, a coating film forming apparatus 200 according to the fourth embodiment of the present invention further includes a coating liquid feed portion 65 formed by a pump applying a pressure to coating liquid 202 to feed coating liquid 202 to nozzle portion 5, and a flowmeter 203 measuring the flow rate of the coating liquid in the channel from coating liquid feed portion 65 to nozzle portion 5. The flow rate from coating liquid feed portion 65 to nozzle portion 5 is adjusted in accordance with the flow rate of the coating liquid measured by flowmeter 203.

Coating liquid 202 is reserved in a tank 201, and is discharged from nozzle portion 5 via coating liquid feed portion 65 and flowmeter 203. Flowmeter 203 measures the flow rate of the coating liquid from coating liquid feed portion 65 to nozzle portion 5, and the measured flow rate data is transmitted to control portion 3. Control portion 3 adjusts the amount of the coating liquid to be supplied by coating liquid feed portion 65, based on the flow rate data.

The other parts of coating film forming apparatus 200 are similar to those in the coating liquid forming apparatuses according to the first to third embodiments.

In coating film forming apparatus 200 configured as described above, the flow rate of the coating liquid is monitored and the result thereof is sent to a pump (coating liquid feed portion 65) as a feedback, to suppress variation in the amount of discharge during coating.

Moreover, when nozzle portion 5 clogs up, the flow rate is lowered. This is detected by flowmeter 203 to feed it back to coating liquid feed portion 65. As a result, the flow rate can be made constant.

Furthermore, when nozzle portion 5 completely clogs up having no flow rate at all, flowmeter 203 may detect this and generate a warning signal.

Fifth Embodiment

Figure 19:
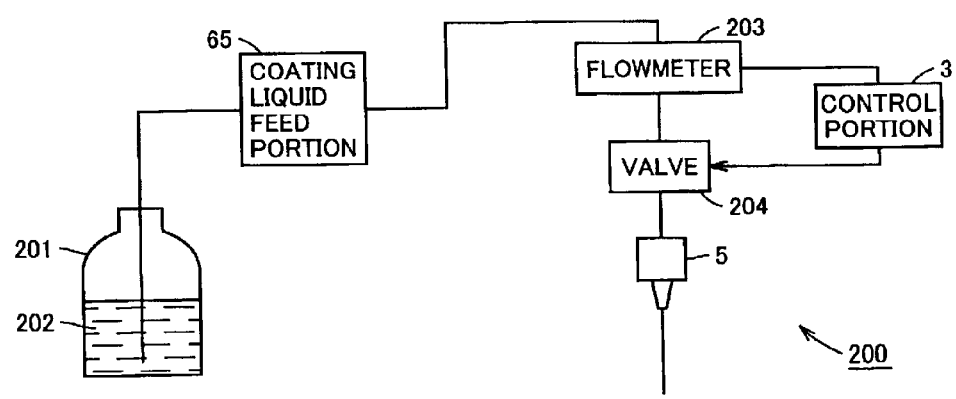
FIG. 19 is a schematic view of a coating film forming apparatus according to the fifth embodiment of the present invention.

FIG. 19 is a schematic view of a coating film forming apparatus according to the fifth embodiment of the present invention. As shown in FIG. 19, coating film forming apparatus 200 according to the fifth embodiment of the present invention further includes a coating liquid feed portion 65 formed by a pump applying a pressure on coating liquid 202 to feed coating liquid 202 to nozzle portion 5, and a flowmeter 203 measuring the flow rate of the coating liquid in the channel from coating liquid feed portion 65 to nozzle portion 5. The flow rate from coating liquid feed portion 65 to nozzle portion 5 is adjusted in accordance with the flow rate of the coating liquid measured by flowmeter 203.

Coating liquid 202 is reserved in tank 201, and is discharged from nozzle portion 5 via coating liquid feed portion 65, flowmeter 203 and a valve 204. Flowmeter 203 measures the flow rate of the coating liquid from coating liquid feed portion 65 to nozzle portion 5, and the measured flow rate data is transmitted to control portion 3. Control portion 3 adjusts the amount of the coating liquid by adjusting an opening of valve 204 based on the flow rate data.

The other parts of coating film forming apparatus 200 are similar to those of the coating film forming apparatuses according to the first to third embodiments.

In coating film forming apparatus 200 configured as above, the flow rate of the coating liquid is monitored and the result thereof is sent to valve 204 as a feedback, to suppress variation in the amount of discharge during coating.

Sixth Embodiment

Figure 20:
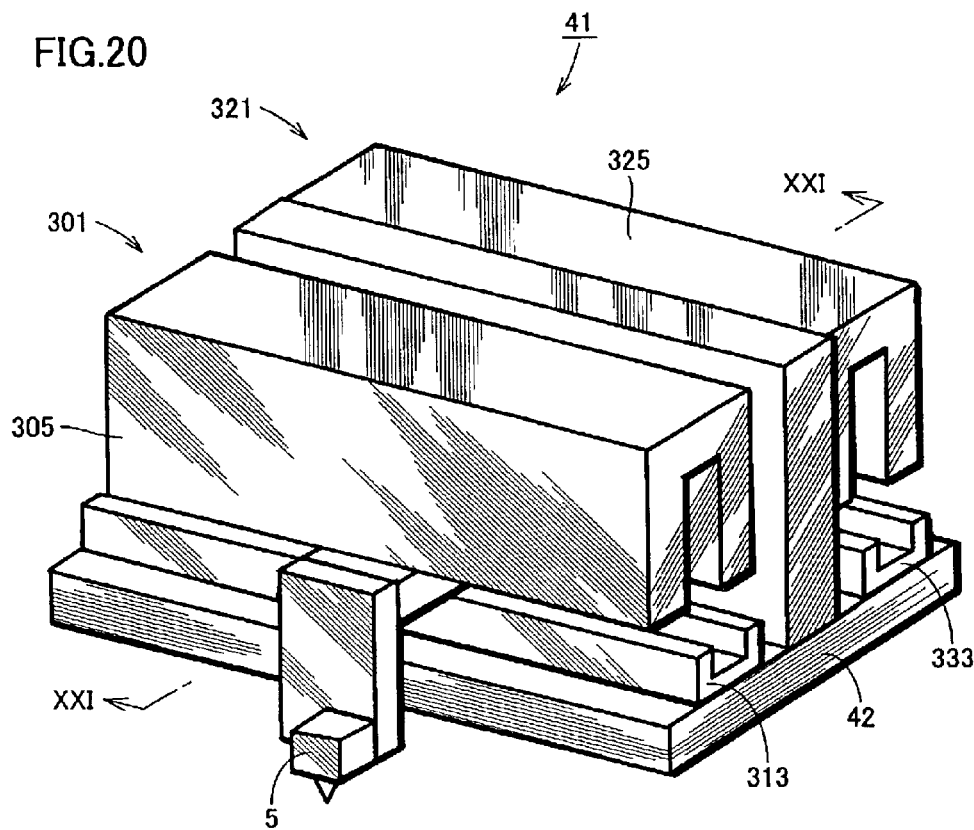
FIG. 20 is a schematic view of an X-direction driving portion used in a coating film forming apparatus according to the sixth embodiment of the present invention.

FIG. 20 is a schematic view of an X-direction driving portion used in a coating film forming apparatus according to the sixth embodiment of the present invention. As shown in FIG. 20, the coating film forming apparatus in the sixth embodiment is different from that according to the first embodiment in that X-direction driving portion 41 as a first driving portion has linear motors 301 and 321. Two linear motors 301 and 321 are not connected with each other, and move in opposite directions on rails 313 and 333.

Figure 21:
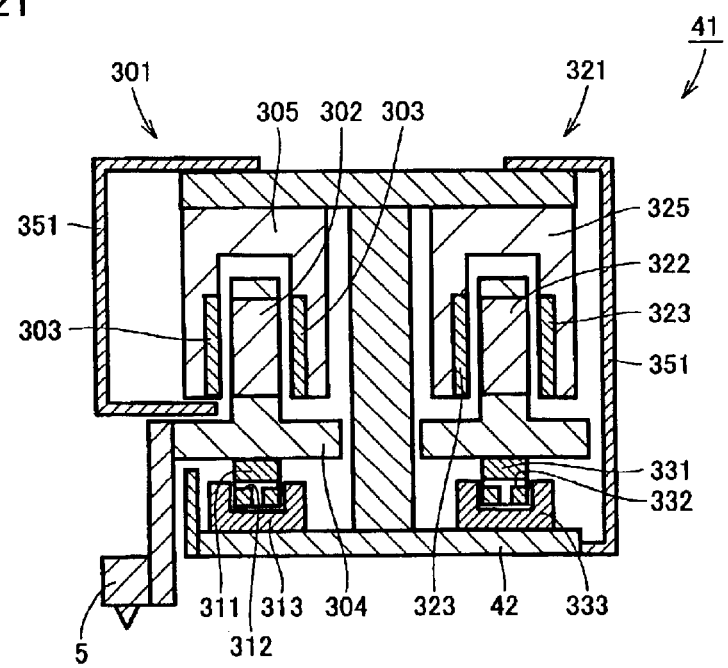
FIG. 21 is a section view taken along the XXI—XXI line in FIG. 20.

FIG. 21 is a section view taken along the line XXI—XXI in FIG. 20. As shown in FIG. 21, rails 313 and 333 are provided on base 42. Air sliders 311 and 331 are so arranged as to be movable on rails 313 and 333. Holes 312 and 332 are formed at air sliders 311 and 331. By ejecting gas from holes 312 and 332, air sliders 311 and 331 may be floated from rails 313 and 333.

Linear motors 301 and 321 are arranged on air sliders 311 and 331. Linear motor 301 is constituted by a coil 302, a coil holding portion 304, a magnet 303 and a magnet holding portion 305. Linear motor 321 is constituted by a coil 322, a coil holding portion 324, a magnet 323 and a magnet holding portion 325.

Coil holding portions 304 and 324 are fixed at air sliders 311 and 331, while coil holding portions 304 and 324 hold coils 302 and 322. Magnets 303 and 323 are provided facing coils 302 and 322. Magnet holding portions 305 and 325 hold magnets 303 and 323. The attraction and repulsion of coils 302 and 322 and magnets 303 and 323 move coil holding portions 304 and 324 constituting linear motors 301 and 321. A cover 351 is provided to cover linear motors 301 and 321. Nozzle portion 5 is attached to coil holding portion 304.

It is noted that cover 351 and an upper part of base 42 shown in FIG. 21 are not shown in FIG. 20.

In thus configured coating film forming apparatus having X-direction driving portion 41, linear motors 301 and 321 cause no vibration, eliminating the adverse effect of vibration and improving the distribution of film thickness because of stable discharge.

EXAMPLE

For confirmation of the effect of the present invention, the coating film forming apparatus shown in FIG. 23 according to the conventional technique was first used, and the coating film forming apparatus according to the present embodiment was subsequently used, to linearly feed coating liquid, setting the amount of discharge of the coating liquid at approximately 0.4 cc/min and the moving speed of the nozzle portion at approximately 1000 mm/sec, for each apparatus. The difference in the height at the center portion on the surface in the longitudinal direction in the lines of the coating liquid was measured to obtain results as shown in FIGS. 22A to 22D.

Figure 22A:
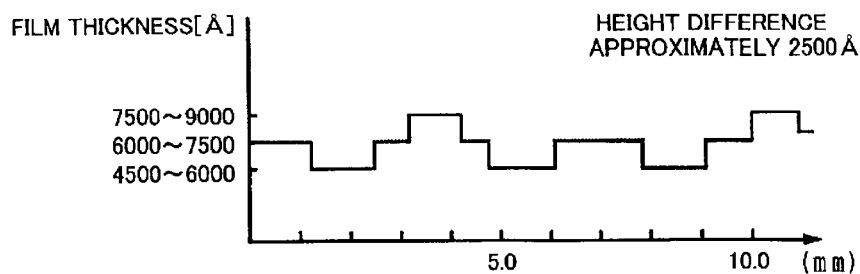
FIGS. 22A to 22D illustrate results obtained in Example.
Figure 22B:
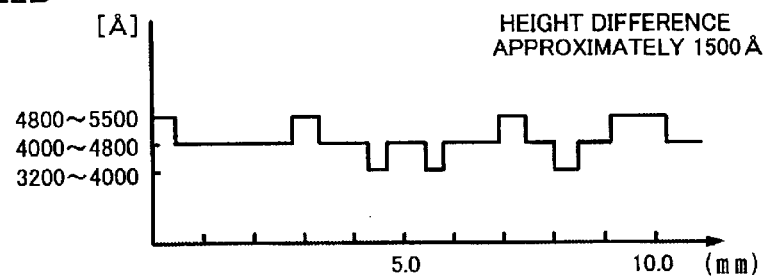
Figure 22C:
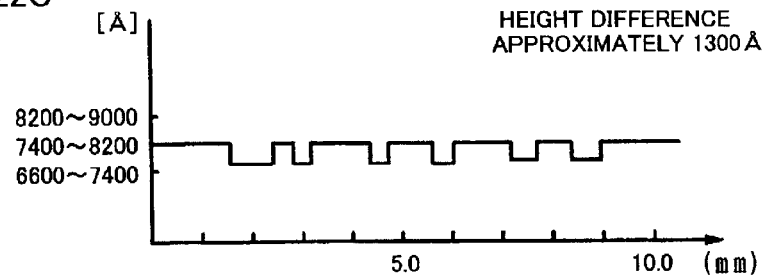
Figure 22D:
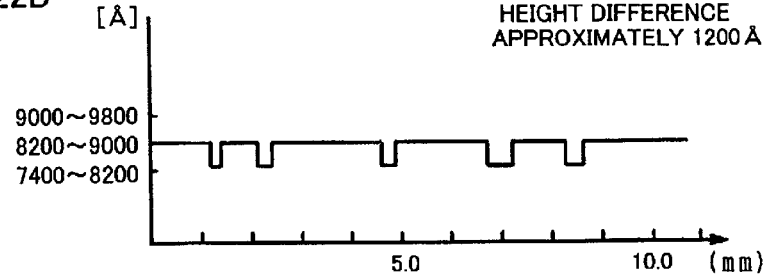
Figure 23:
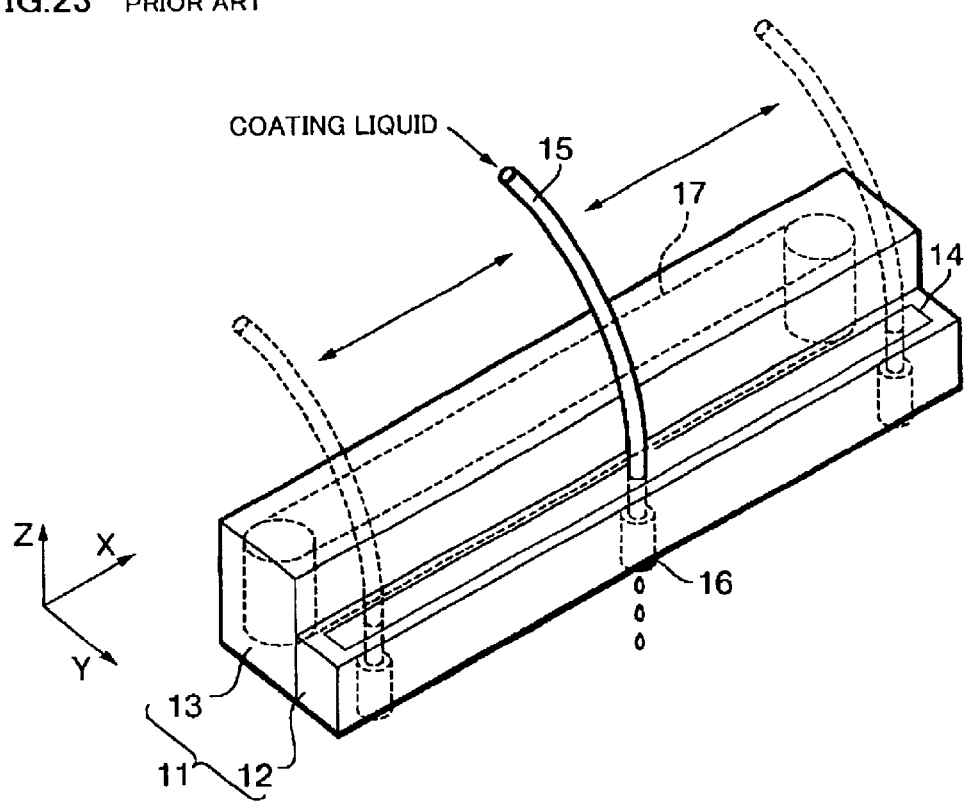
FIG. 23 is a schematic perspective view showing a nozzle unit provided in the coating film forming apparatus according to the conventional invention.
Figure 24:
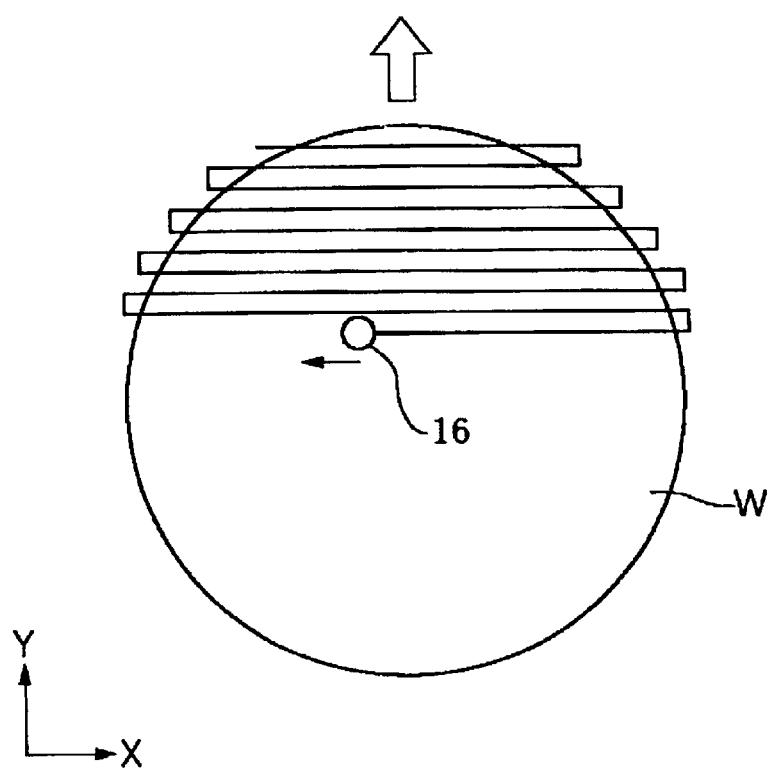
FIG. 24 illustrates the coating process in the coating film forming apparatus according to the conventional invention.
Figure 25:
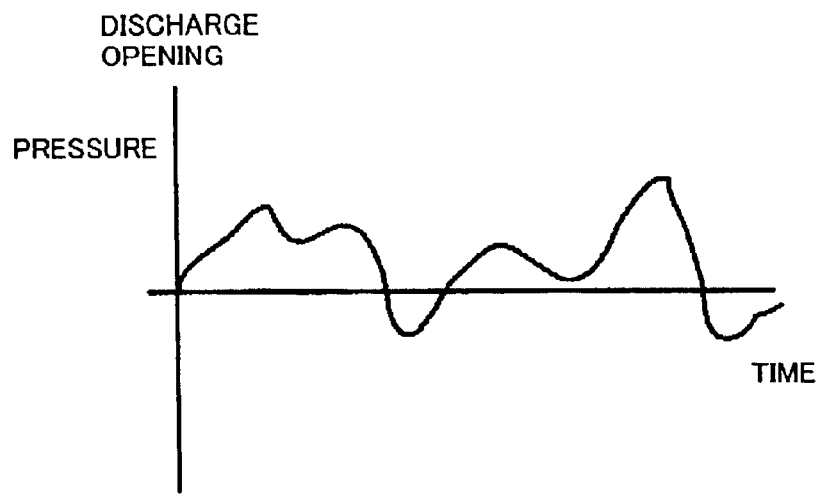
FIG. 25 is a characteristic graph showing occurrence of vibration in the conventional technique.
Figure 26:
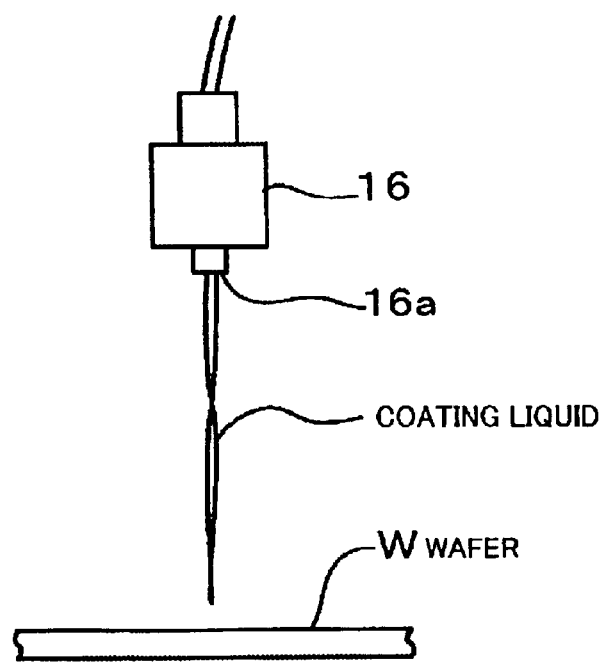
FIG. 26 illustrates feeding of coating liquid in the conventional technique.
Figure 27A:
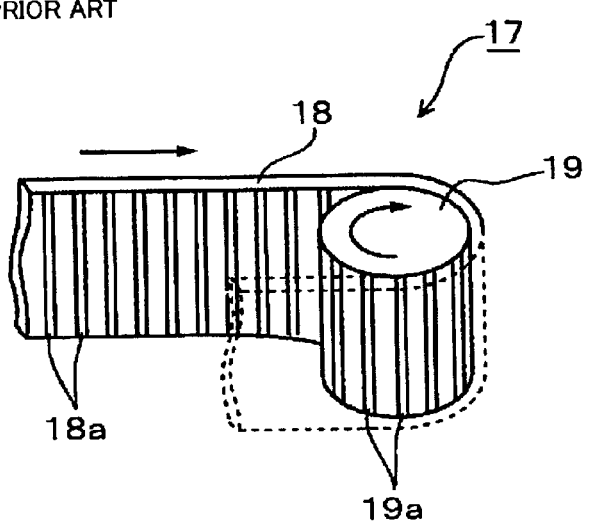
FIGS. 27A and 27B schematically illustrate the structure of the belt driving portion provided in the coating film forming apparatus according to the conventional invention.
Figure 27B:
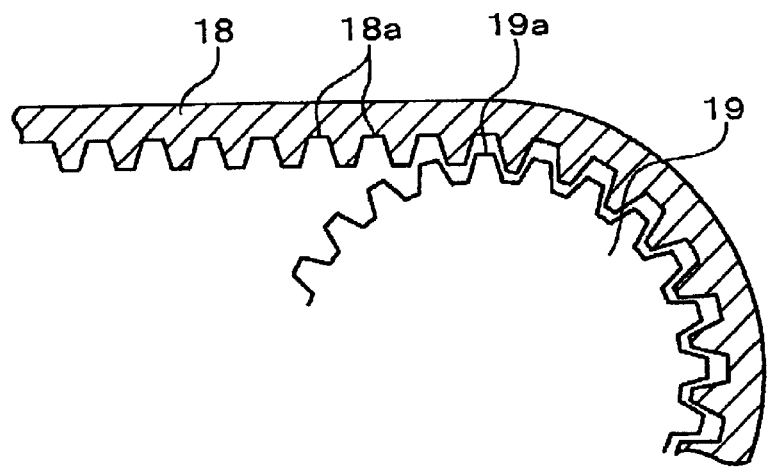

FIG. 22A shows the result in the case where the coating film forming apparatus according to the conventional technique was used, the difference in the surface height of the coating liquid being approximately 2500 Å. As can be seen from the graph, the surface of the coating liquid has a number of concave and convex portions, and a large difference in height. FIG. 22B is for the apparatus shown in FIGS. 1 to 6 of the first embodiment, FIG. 22C is for the apparatus shown in FIG. 11 of the second embodiment, and FIG. 22D is for the apparatus having connecting portion 51 configured as shown in FIG. 11 of the second embodiment based on the apparatus shown in FIGS. 1 to 6 of the first embodiment. The difference in height on the surface was approximately 1500 Å in FIG. 22B, approximately 1300 Å in FIG. 22C, and approximately 1200 Å in FIG. 22D. Further, as can be seen from the graphs, any of the apparatuses according to the present embodiment have results of smaller frequency of concave and convex portions and the difference in height compared to that shown in FIG. 22A.

From the results above, according to the embodiments of the present invention, the difference in height on the surface is reduced to approximately a half, and further, the frequency of concave and convex portions can also significantly be reduced. In particular, in the combination of the first and second embodiments as shown in FIG. 22D, the difference in height of the coating film is reduced to a value equal to or lower than a half, which is more effective compared to use of one embodiment alone.

According to the present invention, therefore, in forming of a coating film on the surface of a substrate by feeding coating liquid to the substrate while a nozzle portion is moved from side to side, discharge of the coating liquid can be stabilized and a coating film having a high inner uniformity in the film thickness can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A coating film forming apparatus comprising:
    a substrate holding portion configured to hold a substrate;
    a nozzle portion configured to feed coating liquid to the substrate via a discharge opening formed at a tip;
    a coating liquid feed path configured to feed the coating liquid to the nozzle portion;
    a channel connecting the discharge opening and the coating liquid feed Path in the nozzle portion and having a section larger in diameter than the discharge opening;
    a pressure loss portion configured to cause pressure loss in the coating liquid flowing through the channel;
    a first driving portion configured to move the nozzle portion in a first direction along a surface of the substrate; and
    a second driving portion configured to intermittently move the nozzle portion relative to the substrate in a second direction crossing the first direction,
    wherein the nozzle portion is configured to be moved in the first direction to apply the coating liquid linearly on the surface of the substrate, the nozzle portion and the substrate configured to be intermittently moved such that the linear coated regions line un in the second direction, said channel comprises a portion having a circular cross section, and said pressure loss portion comprises a sphere configured to close said circular portion in said channel and having a concave portion providing a gap between the sphere and said circular portion.

2. A coating film forming apparatus comprising:

a substrate holding portion configured to hold a substrate;

a nozzle portion configured to feed coating liquid to the substrate via a discharge opening formed at a tip;

a coating liquid feed path configured to feed the coating liquid to the nozzle portion;

a channel connecting the discharge opening and the coating liquid feed path in the nozzle portion and having a section larger in diameter than the discharge opening;

a pressure loss portion configured to cause pressure loss in the coating liquid flowing through the channel;

a first driving portion configured to move the nozzle portion in a first direction along a surface of the substrate; and a second driving portion configured to intermittently move the nozzle portion relative to the substrate in a second direction crossing the first direction, wherein the nozzle portion is configured to be moved in the first direction to apply the coating liquid linearly on the surface of the substrate, the nozzle portion and the substrate configured to be intermittently moved such that the linear coated regions line up in the second direction, and first and second liquid pool portions having diameters larger than one of a diameter of an upper end of said discharge opening and a diameter of a tip of said coating liquid feed path are disposed in said channel, the first and second liquid pool portions connected by a communication channel having a diameter smaller than the diameters of the first and second liquid pool portions.

3. A coating film forming apparatus comprising:

a substrate holding portion configured to hold a substrate;

a nozzle portion configured to feed coating liquid to the substrate via a discharge opening formed at a tip;

a coating liquid feed path configured to feed the coating liquid to the nozzle portion;

a channel connecting the discharge opening and the coating liquid feed Path in the nozzle portion and having a section larger in diameter than the discharge opening;

a pressure loss portion configured to cause pressure loss in the coating liquid flowing through the channel;

a first driving portion configured to move the nozzle portion in a first direction along a surface of the substrate; and a second driving portion configured to intermittently move the nozzle portion relative to the substrate in a second direction crossing the first direction;

a coating liquid feed portion configured to apply a pressure on the coating liquid to feed the coating liquid to said nozzle portion; and a flowmeter configured to measure a flow rate of the coating liquid in a channel from said coating liquid feed portion to said nozzle portion, wherein the nozzle portion is configured to be moved in the first direction to apply the coating liquid linearly on the surface of the substrate, the nozzle portion and the substrate configured to be intermittently moved such that the linear coated regions line up in the second direction, and the apparatus is configured to permit adjustment of the flow rate from said coating liquid feed portion to said nozzle portion in accordance with the flow rate of the coating liquid measured by said flowmeter.

4. A coating film forming apparatus, comprising:

a substrate holding portion configured to hold a substrate;

a nozzle portion configured to feed coating liquid to the substrate;

a first driving portion configured to move the nozzle portion in a first direction along a surface of the substrate;

a vibration absorbing means interposed between said first driving portion and said nozzle portion and configured to suppress propagation of vibration occurring at the first driving portion to said nozzle portion; and a second driving portion configured to intermittently move said nozzle portion relative to the substrate in a second direction crossing the first direction, wherein said nozzle portion is configured to be moved in the first direction to apply the coating liquid linearly on the surface of the substrate, and configured to be intermittently moved relative to the substrate such that the linear coated regions line up in the second direction, and the vibration absorbing means is configured to absorb vibration along a direction different from a direction in which the nozzle portion feeds the coating liquid.

5. The coating film forming apparatus according to claim 4, wherein said first driving portion comprises an endless belt provided along the first direction to correspond to a movement range of said nozzle portion, and said vibration absorbing means is provided between the endless belt and said nozzle portion.

6. The coating film forming apparatus according to claim 4, wherein said vibration absorbing means comprises a portion formed by an elastic body provided at a position between said first driving portion and said nozzle portion.

7. The coating film forming apparatus according to claim 6, wherein said elastic body comprises rubber or a leaf spring.

8. The coating film forming apparatus according to claim 4, wherein said vibration absorbing means comprises a portion formed by a hinge at a position between said first driving portion and said nozzle portion.

9. The coating film forming apparatus according to claim 4, further comprising:

a coating liquid feed portion configured to apply a pressure on the coating liquid to feed the coating liquid to said nozzle portion; and a flowmeter configured to measure a flow rate of the coating liquid in a channel from said coating liquid feed portion to said nozzle portion, wherein the apparatus is configured to adjust the flow rate from said coating liquid feed portion to said nozzle portion in accordance with the flow rate of the coating liquid measured by said flowmeter.

10. A coating film forming apparatus, comprising:

a substrate holding portion configured to hold a substrate;

a nozzle portion configured to feed coating liquid to the substrate;

a first driving portion configured to move the nozzle portion in a first direction along a surface of the substrate; and a second driving portion configured to intermittently move said nozzle portion relative to the substrate in a second direction crossing the first direction, wherein said first driving portion comprises
   an endless belt provided along the first direction to correspond to a movement region of said nozzle portion, and having an inner surface on which a number of grooves and teeth are disposed extending in parallel to form an acute angle to the first direction, and
   a pair of pulleys having grooves and teeth configured to engage with said grooves and teeth of the endless belt over an entire side circumferential surface,
said nozzle portion being configured to be moved in the first direction to apply the coating liquid linearly on the surface of the substrate, and configured to be intermittently moved relative to the substrate such that the linear coated regions line up in the second direction.

11. The coating film forming apparatus according to claim 10, further comprising:
   a coating liquid feed portion configured to apply a pressure on the coating liquid to feed the coating liquid to said nozzle portion; and
   a flowmeter configured to measure a flow rate of the coating liquid in a channel from said coating liquid feed portion to said nozzle portion,
   wherein the apparatus is configured to adjust the flow rate from said coating liquid feed portion to said nozzle portion in accordance with the flow rate of the coating liquid measured by said flowmeter.

* * * * *